United States Patent
Endo et al.

(10) Patent No.: US 7,923,828 B2
(45) Date of Patent: Apr. 12, 2011

(54) STRUCTURE AND METHOD OF MAKING INTERCONNECT ELEMENT, AND MULTILAYER WIRING BOARD INCLUDING THE INTERCONNECT ELEMENT

(75) Inventors: Kimitaka Endo, Tokyo (JP); Norihito Masuda, Tokyo (JP); Tomokazu Shimada, Tokyo (JP)

(73) Assignee: Tessera Interconnect Materials, Inc., San Jose, CA (US)

( * ) Notice: Subject to any disclaimer, the term of this patent is extended or adjusted under 35 U.S.C. 154(b) by 120 days.

(21) Appl. No.: 11/239,744

(22) Filed: Sep. 30, 2005

(65) Prior Publication Data

US 2006/0079127 A1 Apr. 13, 2006

(30) Foreign Application Priority Data

Oct. 1, 2004 (JP) ................................. 2004-289722

(51) Int. Cl.
*H01R 13/60* (2006.01)
(52) U.S. Cl. .......... 257/678; 257/E23.062; 257/E23.173
(58) Field of Classification Search .................. 257/686, 257/E23.062, E23.173
See application file for complete search history.

(56) References Cited

U.S. PATENT DOCUMENTS

| | | | |
|---|---|---|---|
| 5,011,580 A | 4/1991 | Pan et al. | |
| 5,118,385 A | 6/1992 | Kumar et al. | |
| 5,440,805 A | 8/1995 | Daigle et al. | |
| 6,262,376 B1 | 7/2001 | Hurwitz et al. | |
| 6,262,478 B1 | 7/2001 | Hurwitz et al. | |
| 6,280,640 B1 | 8/2001 | Hurwitz et al. | |
| 6,780,673 B2 * | 8/2004 | Venkateswaran | 438/108 |
| 6,838,763 B2 * | 1/2005 | Ahn et al. | 257/698 |
| 7,052,932 B2 * | 5/2006 | Huang et al. | 438/105 |
| 2002/0074641 A1 | 6/2002 | Towle et al. | |
| 2004/0000425 A1 | 1/2004 | White et al. | |

OTHER PUBLICATIONS

Marriam—Webster's Colleciate Dictionary 10th edition, 1993, p. 891.*
Partial International Search Report, PCT/US2005/035459, Dated Mar. 30, 2006.

* cited by examiner

*Primary Examiner* — Benjamin P Sandvik
*Assistant Examiner* — Krista Soderholm
(74) *Attorney, Agent, or Firm* — Lerner, David, Littenberg, Krumholz & Mentlik, LLP

(57) ABSTRACT

An interconnect element is provided which includes a dielectric element having a first major surface, a second major surface remote from the first major surface, and a plurality of recesses extending inwardly from the first major surface. A plurality of metal traces are embedded in the plurality of recesses, the metal traces having outer surfaces substantially co-planar with the first major surface and inner surfaces remote from the outer surfaces. A plurality of posts extend from the inner surfaces of the plurality of metal traces through the dielectric element, the plurality of posts having tops exposed at the second major surface. A multilayer wiring board including a plurality of such interconnect elements is also provided, as well as various methods for making such interconnect elements and multilayer wiring boards.

12 Claims, 16 Drawing Sheets ly to one or more preferred aspects of the invention.

STRUCTURE AND METHOD OF MAKING INTERCONNECT ELEMENT, AND MULTILAYER WIRING BOARD INCLUDING THE INTERCONNECT ELEMENT

CROSS-REFERENCE TO RELATED APPLICATIONS

The present application is based upon and claims the benefit of priority from Japanese Patent Application No. 2004-289722, filed Oct. 1, 2004, the entire contents of which is incorporated herein by reference.

BACKGROUND OF THE INVENTION

The present invention specifically relates to interconnect structures for microelectronics, e.g., in the packaging of microelectronic units such as integrated circuits ("ICS" or "chips") and other interconnect structures, e.g., circuit panels such as printed which may include wiring boards.

In some multi-layer wiring boards, a heat-curable resin such as an epoxy resin is used as an insulator within each wiring level. Interconnections are patterned after a curing reaction performed while the cured substrate is held tightly in a fixture. In this way, interconnections do not twist or break as a result of joining the wiring levels and insulators together in one multilayer board.

Unfortunately, when wiring levels of a multilayer wiring board are insulated by a thermoplastic, presently available methods produce unsatisfactory results. The thermoplastic insulators of each level are joined at temperatures near the melting point of the thermoplastic resin. This causes the metal interconnects within such multilayer wiring boards to twist, short with adjacent interconnections, break, or the like.

In such boards, because the metal interconnect layer protrudes above the surface of each interlayer insulation layer, there was a tendency to have indentations and protrusions on the surfaces of the wiring board layers that make up the multilayer wiring board. When multilayer wiring boards are produced through joining together a plurality of these wiring board layers, the greater the number of layers, the larger the indentations and protrusions on the surface of the multilayer wiring boards. Given this, as wiring boards, the interconnection patterns could become distorted, the adjacent interconnections could short to each other, interconnections could break, and the like, producing fatal defects. In addition, electronic components mounted to such multilayer wiring boards, such as semiconductor integrated circuits, large-scale integrated circuits, and the like, in particular, have large numbers of small terminals. Accordingly, it is highly desirable to maintain the planarity of each set of metal interconnects on an interconnect element or multilayer wiring board. In some cases, large deviations from planarity of the surface of interconnect element on which electronic components such as a chip is mounted is an impediment to high-reliability mounting.

Consequently, excessive indentations and protrusions on the surface of a multilayer wiring board causes problems that cannot be ignored, and thus must be eliminated.

Secondly, given the conventional technology described above, the production of a single multilayer wiring board can require layering process in which one wiring board is joined to another wiring board and in which another wiring board is then joined to the layered unit produced by the prior joining process. This process would then be repeated multiple times, resulting in many manufacturing steps for the multilayer wiring board, making reductions in manufacturing costs difficult.

SUMMARY OF THE INVENTION

According to one aspect of the invention, an interconnect element is provided which includes a dielectric element having a first major surface, a second major surface remote from the first major surface, and a plurality of recesses extending inwardly from the first major surface. A plurality of metal traces are embedded in the plurality of recesses, the metal traces having outer surfaces substantially co-planar with the first major surface and inner surfaces remote from the outer surfaces. A plurality of posts extend from the inner surfaces of the plurality of metal traces through the dielectric element, the plurality of posts having tops exposed at the second major surface.

According to one or more preferred aspects of the invention, the interconnect element may further include a bonding metal layer contacting the outer surfaces of the plurality of metal traces.

According to one or more preferred aspects of the invention, each of the plurality of posts of the interconnect element can be constructed to have an external surface area greater than a surface area of the outer surface of one of the plurality of metal traces from which each the interconnect pillar extends.

According to one or more preferred aspects of the invention, the dielectric element includes a thermoplastic.

According to one or more preferred aspects of the invention, the plurality of metal traces include copper and the plurality of posts include copper.

According to one or more preferred aspects of the invention, the plurality of posts project beyond the second major surface.

According to one or more preferred aspects of the invention, each of the posts includes a base structure including a first metal extending from the plurality of metal traces, the each of the posts further including a bond metal overlying the first metal at the tops.

According to one or more preferred aspects of the invention, the first metal has a first melting point and the bond metal has a second melting point lower than the first melting point.

According to one aspect of the invention, a multi-layer interconnect element includes a plurality of such interconnect elements in which a plurality of posts of a first one of the plurality of interconnect elements are joined to the outer surfaces of the plurality of metal traces of a second one of the plurality of interconnect elements.

According to one or more preferred aspects of the invention, a bond metal is disposed between the plurality of posts of the first one of the plurality of interconnect elements and the plurality of metal traces of the second one of the plurality of interconnect elements.

According to one or more preferred aspects of the invention, the plurality of metal traces include a first metal and the plurality of posts include a second metal, the interconnect element further includes a third metal disposed between each of the plurality of posts and the plurality of metal traces, the third metal having a composition such that it is not attacked by an etchant which attacks the second metal. According to a particular aspect of the invention, the first metal and the second metal are the same metal. Alternatively, the first metal and the second metal can be different metals.

According to a particular aspect of the invention, a method is provided for manufacturing an interconnect element in which the metal layer including the plurality of metal traces is fabricated by selectively depositing a bond metal layer on a carrier layer through a mask layer overlying the carrier layer and plating a second metal layer onto the bond metal layer through the mask layer, thereafter, removing the mask layer, and fabricating a second mask layer on the metal layer including the plurality of metal traces. In such method, the plurality of posts are formed by plating a metal into openings within the second mask layer, and the dielectric element is provided by fabricating an interlayer insulation layer and, on an exposed surface of the interlayer contact pillar, a low melting point metal layer for improving connectivity.

According to another aspect of the invention, a method is provided for manufacturing an interconnect element, such method including fabricating a metal layer overlying a carrier layer, the metal layer including a plurality of metal traces. A dielectric element is provided to overlie the metal layer and the carrier layer such that outer surfaces of the plurality of metal traces and a first major surface of the dielectric element are adjacent to the carrier layer, and inner surfaces of the plurality of metal traces are disposed within recesses in the dielectric element remote from the outer surfaces, the dielectric element having a second major surface remote from the first major surface. A plurality of metal posts are provided to extend from the inner surfaces of the plurality of metal traces at least to the second major surface of the dielectric element. The method further includes removing the carrier layer to expose the first major surface of the dielectric element and the outer surfaces of the plurality of metal traces.

According to one or more particular aspects of the invention, the outer surfaces of the plurality of metal traces are substantially co-planar with the first major surface of the dielectric element.

According to one or more particular aspects of the invention, the carrier layer includes a metal and the plurality of metal traces are formed by patterning openings in a layer of photoresist and plating the plurality of metal traces within the openings.

According to one or more particular aspects of the invention, an etch-resistant layer is provided on the carrier layer prior to plating the plurality of metal traces within the openings such that during the step of removing the carrier layer, the etch-resistant layer protects the plurality of metal traces from being attacked during the step of removing the carrier layer.

According to one or more particular aspects of the invention, the step of providing the plurality of metal posts includes etching a layer of metal overlying the inner surfaces of the plurality of metal traces and the step of providing the dielectric element includes forming the dielectric element after the plurality of metal posts are provided to extend from the inner surfaces of the plurality of metal traces.

According to one or more particular aspects of the invention, a method is provided for making a multi-layer interconnect element which includes the above-described method of making an interconnect element. In such method the plurality of posts of a first one of the plurality of interconnect elements are simultaneously joined to the outer surfaces of the plurality of metal traces of a second one of the plurality of interconnect elements. In addition, the first major surface of a dielectric element of a first one of the interconnect elements is simultaneously joined to a second major surface of a dielectric element of a second one of the interconnect elements.

According to one or more particular aspects of the invention, the step of simultaneously joining also joins the plurality of posts of the second one of the plurality of interconnect elements to the outer surfaces of the plurality of metal traces of a third one of the plurality of interconnect elements.

According to one or more particular aspects of the invention, the step of simultaneously joining includes simultaneously fusing a bond metal disposed between the plurality of posts of the first one of the plurality of interconnect elements and the plurality of metal traces of the second one of the plurality of interconnect elements and fusing a bond metal disposed between the plurality of posts of the second one of the plurality of interconnect elements and the plurality of metal traces of the third one of the plurality of interconnect elements.

According to a particular aspect of the invention, a method of manufacturing a multilayer wiring board is provided wherein a plurality of wiring boards having a plurality of interconnection layers, made from metal, are fabricated on one primary surface of an interlayer insulation layer in an embedded state so that a primary surface of the interconnection layers will be coplanar with the one primary surface of the interlayer insulation layer; an interlayer contact pillar is fabricated from metal on at least a part of an interconnection layer on the other primary surface of the plurality of interconnection layers, so as to pass through the interlayer insulation layer so as to arrive at, and be exposed at, the other primary surface the interlayer insulation layer; and a low melting point metal layer for improving connectivity is fabricated on the exposed surface of the interlayer contact pillar, are prepared. The plurality of prepared wiring boards are joined in a stack such that the interlayer insulation layers of adjacent wiring boards will be fused and integrated together, along with the interconnection layer of one wiring board connecting to the interlayer contact pillar of another wiring board, or the interlayer contact pillar of one wiring board being connected to the interlayer contact pillar of another wiring board, through a low melting point metal layer for improving connectivity, when connecting, through the low melting point metal layer for improving connectivity, through applying heat and applying pressure when the prepared plurality of wiring boards are in a state wherein the prepared plurality of wiring boards are aligned so that the interconnection layer of one wiring board contacts the interlayer contact pillar of another wiring board, or the interlayer contact pillar of one wiring board contacts the interlayer contact pillar of another wiring board, through the interlayer contact pillar.

DETAILED DESCRIPTION

According to certain embodiments of the invention, a multilayer wiring board is provided wherein the inner-layer patterns do not become twisted, do not produce shorts with adjacent interconnections, and do not break even when the number of layers is high. In such embodiments, the surface of each interconnect element within a multilayer wiring board has a substantially planar major surface. In this way, interconnect features does not protrude in ways which interfere with mounting electronic components. Also, improved reliability of the electrical connections may be achieved between the wiring boards that constitute the multilayer wiring board. In addition, it may be possible to achieve a reduction in the manufacturing processes required to fabricate such interconnect elements.

Figure 1A:
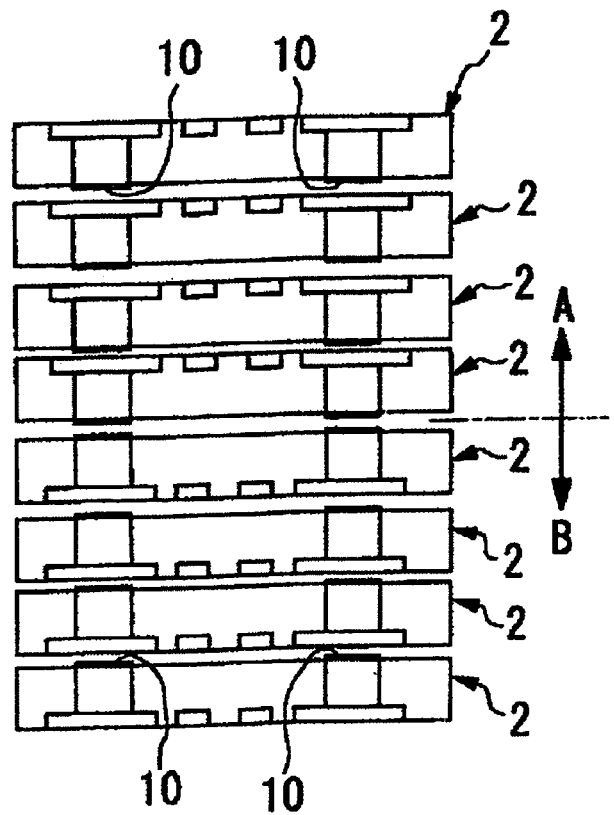
FIG. 1 (A) through (C) are cross-sectional drawings showing one example of embodiment according to the present invention, where (A) is a cross-sectional diagram showing a state prior to joining a plurality of wiring board layers or levels (in this case, 8 wiring boards) (B) is a cross-sectional diagram showing a multilayer wiring board produced after joining multiple wiring board layers and (c) is a cross-sectional diagram of a single interconnect element or wiring board layer of a multilayer wiring board.
Figure 1B:
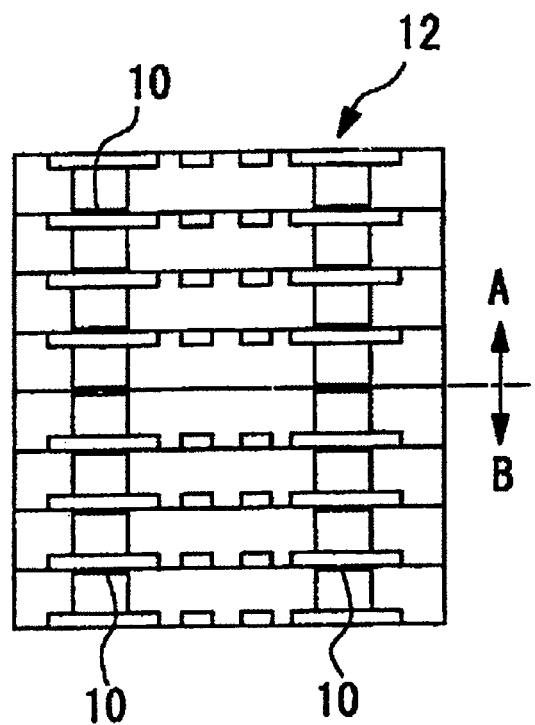
Figure 1C:
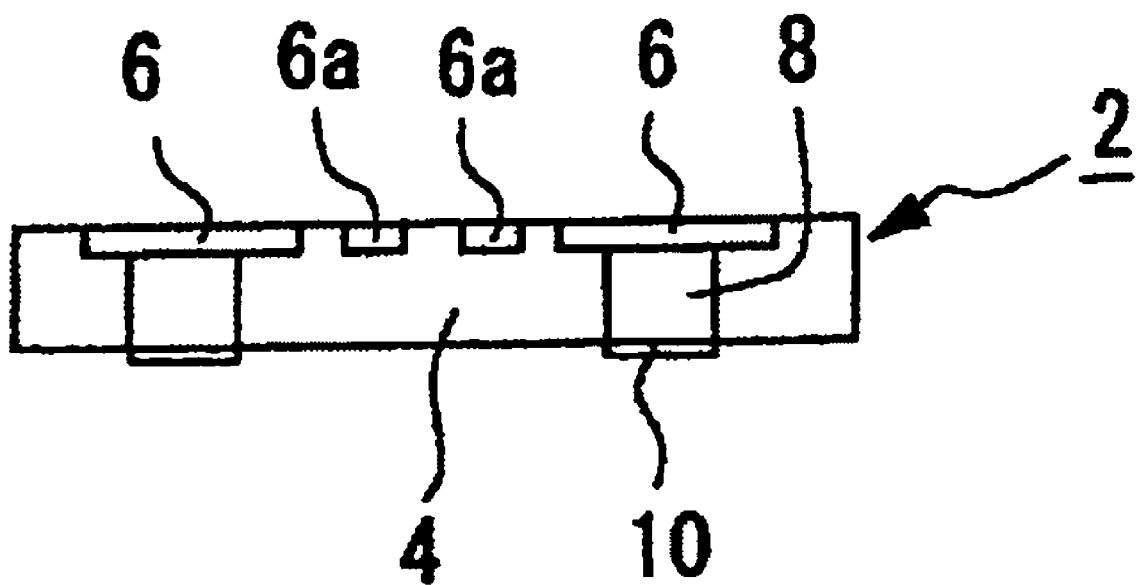
Figure 2A:
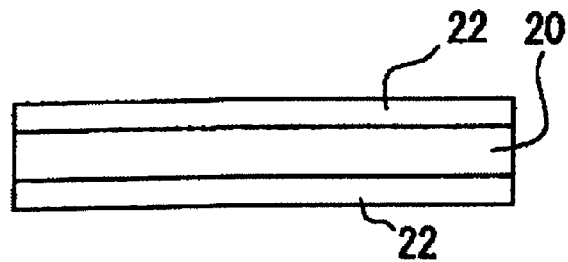
FIG. 2 (A) through (L) are cross-sectional diagrams showing an example of a manufacturing process for a method of manufacturing the interconnect element or wiring board layer shown in FIG. 1 (C), where (L) is a cross-sectional drawing for explaining an alternative example the method for manufacturing.
Figure 2B:
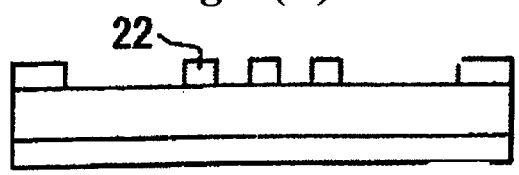
Figure 2C:
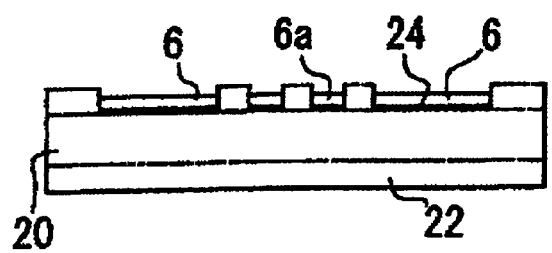
Figure 2D:
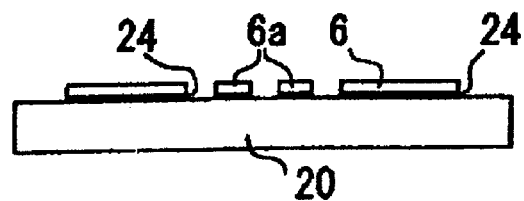
Figure 2E:
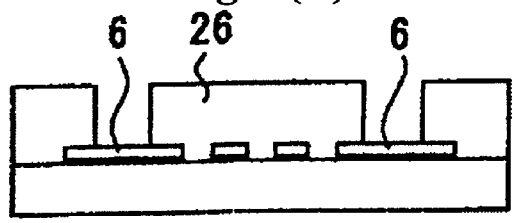
Figure 2F:
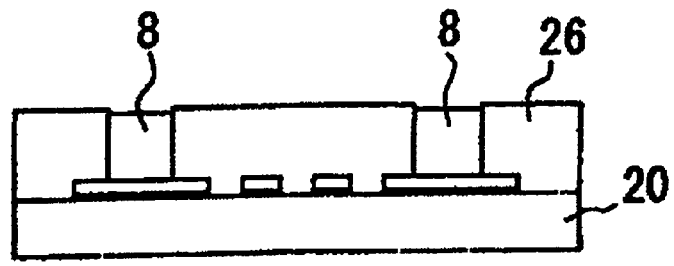
Figure 2G:
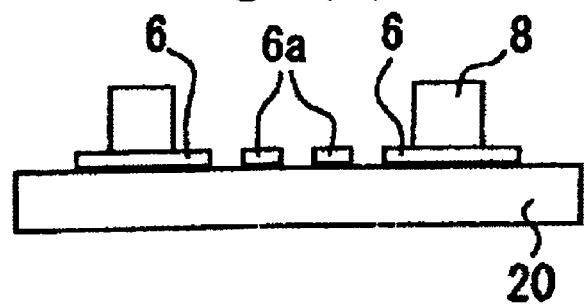
Figure 2H:
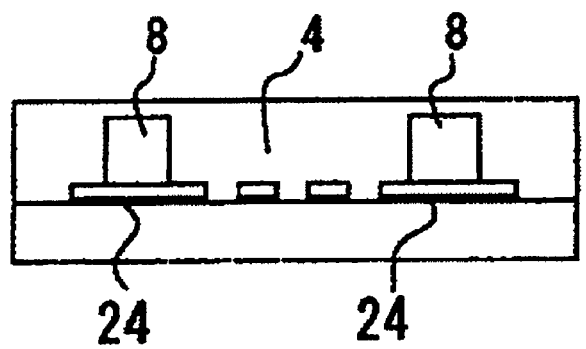
Figure 2I:
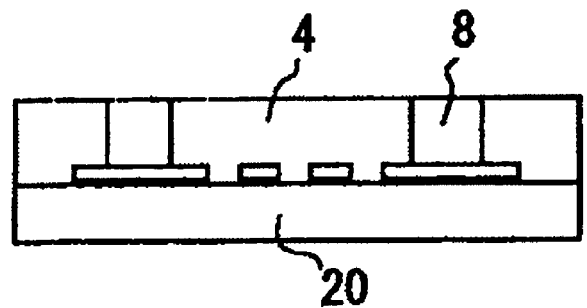
Figure 2J:
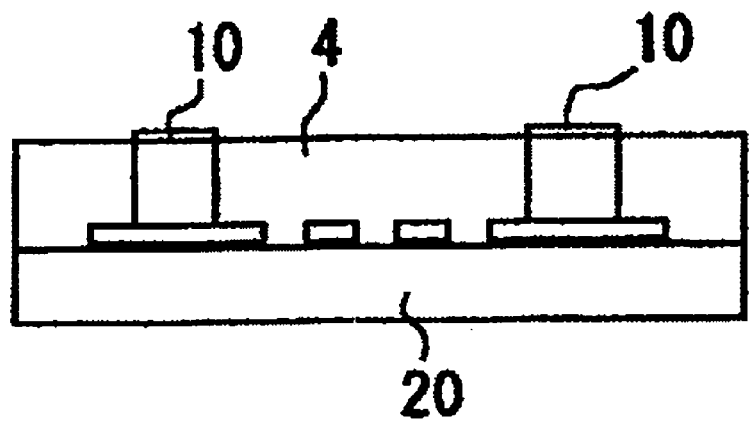
Figure 2K:
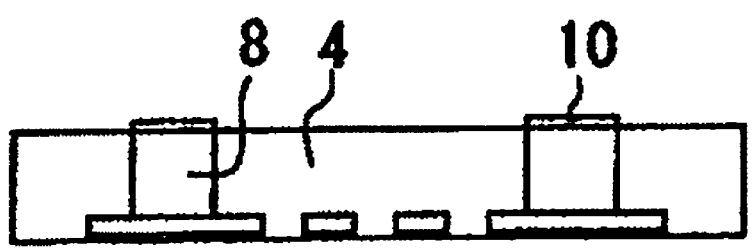
Figure 2L:
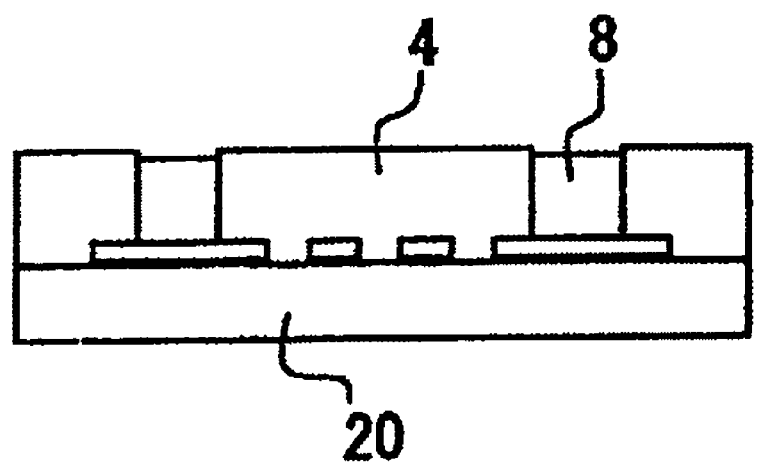

In an interconnect element according to an embodiment of the present invention shown in FIG. 1C, a dielectric layer 4, preferably includes a thermoplastic resin, where, for example, PEEK (polyether ether ketone) resin, PES resin, PPS (polyphenylene sulfide) resin, PEN (polyethylene napthalate) resin, a PEEK-PES resin polymer blend, and liquid crystal polymers are specific examples of suitable resins. The thickness of the dielectric layer is preferably between several dozen and several hundred microns.

A metal wiring layer including metal traces functions as an interconnection layer 6 and a plurality of posts extend therefrom, the posts functioning as contact pillars 8 for contacting other microelectronic elements, e.g., circuit panels, chips, package elements and the like. The posts may function as interlayer contact pillars 8 joining one interconnect element to another in a multilayer wiring board. The posts most preferably include or consist essentially of copper. Preferably the posts include high purity copper. The thickness of the interconnection layer is preferably between 10 and several dozen microns, and the length or height of the posts extending from the interconnection layer is preferably between, for example, several dozen and about 150 microns but may be shorter or longer. A bond metal layer, being preferably a low melting point metal layer for improving connectivity, overlies a surface of posts, e.g. interlayer contact pillars 8 having tops exposed at second major surface of the interlayer insulation layer. The bond metal layer preferably has a melting point between 150 and 350° C., with a thickness between two and ten microns. A low-melting point alloy having components such as tin, zinc, lithium, bismuth, lead, antimony, silver, copper, gold, aluminum, or the like, is suitable and preferred for use as the bond metal layer 10.

In a particular embodiment a chip is joined to or contacted by the interconnect element. Such interconnect element can be further contacted on a side opposite the chip by a circuit panel, a second chip, or package element of a packaged chip. In another embodiment, the interconnect element 2 can be contacted by a packaged chip and maintain conductive communication with the packaged chip under moderate pressure in which some flexing of the dielectric layer 4 may occur as a result of the pressure between the interconnect element and the packaged chip.

In an embodiment of manufacturing a multilayer wiring board, heating to a temperature of, for example, between 150 and 350° C. is suitable, and a pressure between 20 and 100 kg/cm$^2$ is preferred. In addition, it is preferable to provide a bond metal on both front and rear surfaces of the interconnect element, especially when electronic components are to be mounted thereto such as integrated circuits (ICs or chips) that have high numbers of terminals with minute pitches. Gold is well suited for use as the bond metal layer 10.

FIG. 1 (A) through (C) illustrate a first embodiment according to the present invention, where (A) is a cross-sectional diagram of the state prior to joining a plurality of interconnect elements, specifically wiring board layers to be joined together in a stacked arrangement (eight wiring boards in the present example), (B) is a cross-sectional diagram of the multilayer wiring board produced that results after joining the wiring board layers, and (C) is a cross-sectional diagram of a single interconnect element or wiring board which can be joined to other such wiring board layers to form the multilayer wiring board.

First, the interconnect element 2 or wiring board layer will be explained in reference to FIG. 1 (C). A dielectric layer, e.g., an interlayer insulation layer 4 includes, for example, a thermoplastic resin made from, for example, a PEEK resin, a PES resin, a PPS resin, a PEN resin, a PEEK-PES resin polymer blend, or a liquid crystal polymer. References 6 and 6*a* are metal traces of one or more interconnection layers embedded within recesses in a first major surface (e.g., an outer surface) of the aforementioned interlayer insulation layer 4. Outer surfaces of the interconnection layers 6 and 6*a* are coplanar with the outer surface, i.e., the first major surface of the aforementioned interlayer insulation layer 4. The interconnection layer 6 is an interconnection layer having posts, e.g. interlayer contact pillars (8), described below, extending therefrom through the dielectric layer 4 beyond the second major surface. The interconnection layer 6*a* is an interconnection layer whereon no post or interlayer contact pillar (8) extends from its surface through the dielectric layer 4. These interconnection layers 6 and 6*a* are made from, for example, copper, and have a thickness between about 10 and several dozen microns.

Posts 8, e.g. interlayer contact pillars are provided within the interlayer insulation layer 4 so as to extend from the surface on the inner (dielectric layer covered) side of the interconnection layer 6 such that the posts are exposed at the second major surface of the dielectric layer 4. In a particular embodiment, the exposed surface of the posts can be coplanar with the second major surface of the interlayer insulation layer 4, and the post and the interconnection layer 6 both consist essentially of copper.

Bond metal layer 10 is preferably a low melting point metal layer for improving connectivity, as a layer overlying a surface of the aforementioned interlayer contact pillar 8 that is exposed at the second major surface of the aforementioned dielectric layer 4. The bond metal layer 10 preferably has a melting point of, for example, between 150 and 350° C., and a thickness of between two and 10 microns. For the bond metal, a low melting point material or alloy, or the like, with, as constituents, tin, zinc, lithium, bismuth, lead, antimony, silver, copper, gold, aluminum, or the like, is preferred.

Next, the method of manufacturing a multilayer wiring board from a plurality of wiring board layers 2 will be explained with reference to FIGS. 1 (A) and (B).

A plurality of wiring board layers 2 shown in FIG. 1 (C) (eight wiring boards 2 in the present example) are prepared, and are aligned and stacked as shown in FIG. 1 (A). Note that gaps are shown between the adjacent wiring boards 2 and 2 in order to illustrate that this is a state wherein the wiring boards 2 are merely aligned and stacked.

Note that of the eight wiring boards 2, 2, ... the top four of the wiring boards 2, 2, 2, 2 are oriented so that the interconnection layers 6 and 6*a* are facing upwards and the surfaces whereon the interlayer contact pillars 8 are exposed on the surface on the back sides of the interlayer insulation layers 4 (with the low melting point metal layer 10 for improving connectivity fabricated on said exposed surfaces) are facing downwards. The bottom four wiring boards 2, 2, 2, 2 are oriented in the opposite direction with the surfaces wherein the interlayer contact pillars 8 are exposed at the surface facing upwards and the outer surfaces of the interconnection layers 6 and 6*a* are facing downwards. The single dotted line shown the height of the middle, where the side above the line shall be defined as A and the side below the line shall be defined as (B).

In this way, having the orientation of A and B be different enables electronic components, such as ICs, to be mounted to outward facing major surfaces of the interconnection layers 6, 6*a* on both sides of the multilayer wiring board 12.

Consequently, at the interface between A and B, the interlayer contact pillars 8 and 8 of the wiring boards 2 and 2 are connected to each other through the bond metal layers, or low melting point metal layers 10 and 10 of respective wiring boards 2. Moreover, although there is the same number of wiring boards 2 on the A side as on the B side, this need not necessarily be the case. A variety of configurations is possible such as having a single wiring board 2 on the A side with all of the remaining wiring boards 2 on the B side, or conversely, having a single wiring board 2 on the B side with all of the remaining wiring boards 2 on the A side, etc.

However, a plurality of the wiring boards 2 shown in FIG. 1 (C) may be stacked and layered on a double-sided wiring board (not shown) having interconnection layers 6 and 6*a* on both surfaces thereof. However, in such a case it would be necessary to prepare wiring boards 2, shown in FIG. 1 (C), with interconnection layers 6 and 6*a* on only one side thereof, and also to prepare wiring boards with a different structure having the interconnection layers 6 and 6*a* on both surfaces thereof. From the perspective of manufacturing efficiency, it is preferable to structure the multilayer wiring board from only the wiring boards 2 having the same structure shown in FIG. 1.

As is shown in FIG. 1 (A), the application of heat and pressure in a state wherein the wiring boards 2 are aligned and stacked connects the interconnection layers 6 of one wiring board to the interlayer contact pillar 8 of another wiring board through the aforementioned bond metal layer, e.g., a low melting point metal layer 10. In addition, the posts or interlayer contact pillars 8 and 8 are connected to each other through the bond metal layer 10. At the same time, the application of heat and pressure also fuses together and integrates the interlayer insulation layers 4 and 4 of adjacent wiring boards 2 and 2 to each other. The heating temperature is, for example, 150 to 350° C., with an appropriate temperature selected depending on the type of resin. The applied pressure should be, for example, between 20 and 100 kg/cm².

Given this, the resins of the adjacent wiring boards 2 and 2 are layered and integrated together, producing a multilayer wiring board 12 with eight layers, wherein the plurality of wiring boards 2, 2, ... (eight wiring boards 2 in the present example) are layered as shown in FIG. 1 (B).

In each of the wiring boards 2 that constitute the multilayer wiring board 12 shown in FIG. 1B, the interconnection layers 6 an 6*a* on the surface on the front side of the interlayer insulation layer 4 are such that the outer surfaces of the metal interconnection layers 6 and 6*a* are coplanar with the major surface, i.e., front side of the interlayer insulation layer 4 (i.e., the surfaces are positioned on the same plane). In addition, the surface of the post 8 or interlayer contact pillar 8 that is exposed at the other major surface (back side) of the interlayer insulation layer 4 is coplanar with that back side surface of the interlayer insulation layer 4. Thus, both of the major surfaces of the multilayer wiring board 12 are essentially planar or flat. However, the bond metal layer 10 may protrude slightly from the plane. When put under pressure, the bond metal layer squeezes to the side when the wiring board layers 2 are joined together. Since the surface area of the posts and bond metal layer are small compared to the surface area of the wiring board layer 2 as a whole, the effect on the planarity of the wiring board, and on deformation of interconnections, etc., can be ignored.

Consequently, because the multilayer wiring board 12 is structured by joining a plurality of such flat wiring boards 2 and 2, the major (top and bottom) surfaces of the multilayer wiring board 12 can be made planar even when the number of layers of the wiring boards 2 is increased. In such way, a multilayer wiring board 12 is provided in which planarity is provided, such that there is little risk of an impediment to the mounting of electronic components.

Moreover, the electrical connection between the adjacent stacked wiring boards 2 and 2 is formed through metal bonding with the interconnection layer through the application of heat and pressure to the low melting point bond metal layer 10. As the bond metal layer is interposed between the interconnection layer 6 and a post 8 or interlayer contact pillar 8 or between two posts or interlayer contact pillars 8 and 8, improved connection reliability is provided. This permits multilayer wiring boards 12 to be provided with stable and highly reliable electrical properties and low defect rates.

Moreover, because the multilayer wiring board 12 is produced through aligning and stacking a plurality of wiring board layers 2 in a batch and applying heat and or applying pressure only once to join the wiring board layers, the amount of work involved in manufacturing the multilayer wiring board 12 can be reduced compared to the conventional manufacturing method of repeated steps of stacking and joining layers to a partially completed stack of wiring board layers. In this way, it is possible to reduce manufacturing cost, and, by extension, enable reductions in the cost of the multilayer wiring board 12.

FIGS. 2 (A) through (K) are cross-sectional diagrams showing the manufacturing process in one example of a method of manufacturing the wiring board 2 shown in FIGS. 1 (C), and (L) is a cross-sectional diagram for explaining an alternative example of the manufacturing method.

First FIG. 2 (A) through (K) will be referenced to explain an example of a method for manufacturing the wiring board 2.

As shown in FIG. 2 (A), resist layers 22 are formed on both major surfaces (the surface on the front side and the surface on the opposite or back side) of a carrier layer 20 (with a thickness of, for example, several dozen to several hundred microns). Preferably, the carrier layer includes or consists essentially of copper. However, a resin may be used instead as a carrier layer 20.

Next, as shown in FIG. 2 (B), the resist layer 22 on the surface on one side is patterned through exposure and development to become a mask for fabricating the interconnection layers 6 and 6a.

Next, with reference to FIG. 2 (B), using the aforementioned resist layer 22 as a mask, an etching barrier layer 24 including, for example, nickel, is plated first (to a thickness of, for example, between 0.5 and 5 µm), and then the interconnection layers 6 and 6a including, for example, copper are formed through plating. FIG. 2 (C) shows the state after these interconnection layers 6 and 6a have been fabricated. The etching barrier layer 24 fulfills the role of preventing the interconnection layers 6 and 6a from being etched when the carrier layer 20 is removed at a later point in the process by etching, as described below with reference to FIG. 2 (K).

Next, as shown in FIG. 2 (D), the aforementioned resist layer 22 is removed.

Next, as shown in FIG. 2 (E), a resist layer 26 is deposited and patterned photolithographically as a mask for fabricating a set of posts or interlayer contact pillars 8.

Next, as is shown in FIG. 2 (F), the aforementioned resist layer 26 is used as a mask in fabricating the interlayer contact pillars 8 through plating with copper. Note that the fabrication of these interlayer contact pillars 8 is performed through overplating. Overplating refers to plating to a thickness that is thicker than a specific thickness, or in other words, plating to a thickness that is thicker than the thickness of the resist layer 26. Afterwards, etching or polishing can be performed to reduce the height of the interlayer contact pillar 8 to a specific value.

Next, as shown in FIG. 2 (G), the resist layer 26 is removed.

Next, as shown in FIG. 2 (H), the interlayer insulation layer 4 is fabricated through coating or through adhering a resin film via pressure. The thickness of this interlayer insulation layer 4 is a thickness that is greater than that of the aforementioned interlayer contact pillars 8.

Next, as shown in FIG. 2 (I), the aforementioned interlayer insulation layer 4 is polished so as to expose the surface of the aforementioned posts or interlayer contact pillars 8 so that the tops of the posts will be coplanar with the surface of the interlayer insulation layer 4.

Next, as shown in FIG. 2 (J), a low melting point metal layer 10 for improving connectivity is fabricated through, for example, plating on the exposed surfaces of the aforementioned interlayer contact pillars 8.

Next, as shown in FIG. 2 (K), the carrier layer 20 is removed through etching. When the carrier layer 20 includes or consists essentially of copper, the aforementioned etching barrier layer 24 fulfills the role of preventing corrosion, by the etching fluid, of the interconnection layers 6 and 6a, which also include or consist essentially of copper.

Additional processing may then be performed to completely remove the etching barrier layer 24. However, some residual material may be left behind after such removal process.

Note that after the interlayer contact pillars 8 have been made coplanar with the surface of the interlayer insulation layer 4, e.g., by polishing as shown in process (I), above, then, as shown in FIG. 2 (L), the height of the interlayer contact pillars 8 above the interconnection layer may be reduced, through etching slightly the surfaces of the interlayer contact pillars 8 using the interlayer insulation layer 4 as a mask. Thereafter, in the subsequent process (J), a bond metal layer 10 which may include a low melting point metal is formed, which can be done such that the bond metal layer 10 will be coplanar with the surface of the interlayer insulation layer 4. Alternatively, the bond metal layer 10 can be made such that it protrudes beyond the major surface of the interlayer insulation layer 4.

In a variation of the above described embodiment, instead of removing the resist layer 26 and replacing it with the interlayer insulation layer 4, the resist layer 26 having an appropriate composition, can be left in place, and used, as it is, as the interlayer insulation layer 4 or a portion thereof.

Figure 3A:
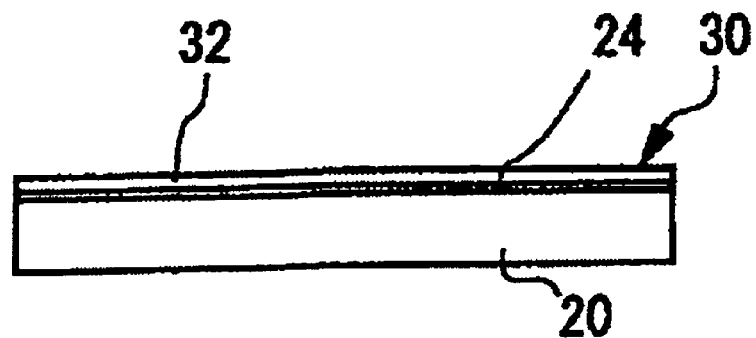
FIG. 3 (A) through (C) are cross-sectional diagrams showing the manufacturing process for an alternative example for a method of manufacturing the interconnect elements or wiring board layers shown in FIG. 1.
Figure 3B:
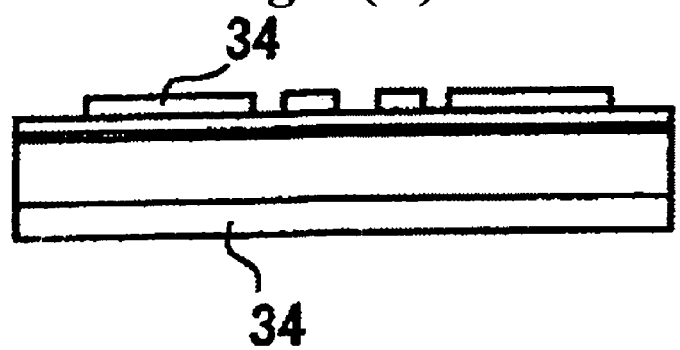
Figure 3C:
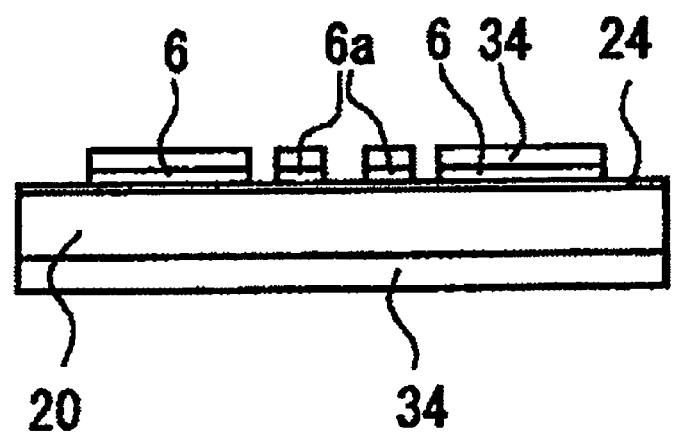
Figure 4A:
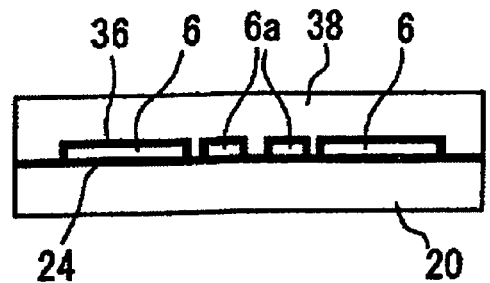
FIG. 4 (A) through (D) are cross-sectional drawings of a manufacturing process for another alternative example of a method for manufacturing the interconnect element or wiring board layer shown in FIG. 1.
Figure 4B:
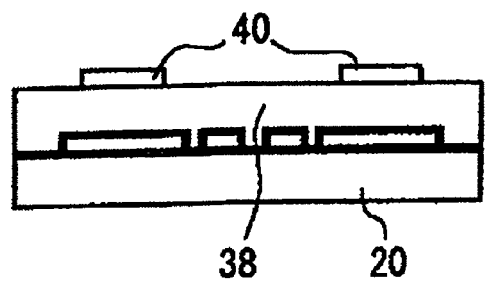
Figure 4C:
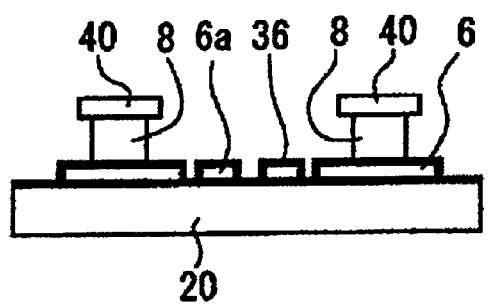
Figure 4D:
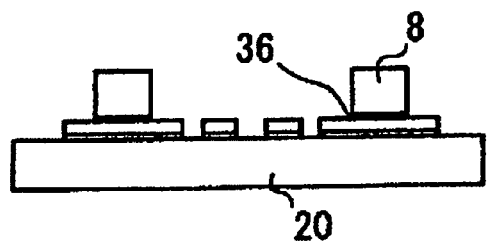

FIGS. 3 (A) through (C) are cross-sectional diagrams showing an alternative embodiment for manufacturing the wiring board shown in FIG. 2 (A). As shown in FIG. 3 (A), a metal plate 30 has a three-layer structure. A carrier layer 20 includes copper. An etching barrier layer 24 includes nickel or other metal that is not attacked by an etchant which attacks the carrier layer. Another copper layer 32 that will form the interconnection layers (6 and 6a) is part of the layered structure produced through rolling.

A resist layer 34 is coated onto both sides of the metal layer 30, and the part of this resist layer 34 that covers the copper layer 32 is patterned through exposure and development through to a mask for fabricating the interconnection layers 6 and 6a through etching. FIG. 3 (B) shows the state after the resist layer is patterned.

Next, as shown in FIG. 3 (C), the interconnection layers 6 and 6a are patterned by etching the aforementioned copper layer 32 using the aforementioned resist layer 34 as a mask.

After this, the partially completed interconnection element is processed by the series of processes beginning with the process described above relative to FIG. 2 (D) through 2 (K) or 2 (L) to form a completed interconnection element or wiring board layer.

FIG. 4 (A) through (D) are cross-sectional diagrams showing another alternative embodiment for manufacturing a wiring board shown in FIG. 2.

After completing the processes shown in FIGS. 2 (A) through (D), described above, an etching barrier layer 36, made from, for example, nickel is fabricated on the surface on the side whereon the interconnection layers 6 and 6a have been fabricated. Thereafter, a copper layer, for example, layer 38, which will form the interlayer contact pillars 8 is formed, preferably through plating or alternatively by another deposition technique. FIG. 4 (A) shows the state after the copper layer 38 has been fabricated.

Next, as shown in FIG. 4 (B), a resist layer 40 is deposited and photolithographically patterned on the surface of the aforementioned copper layer 38.

Next, as shown in FIG. 4 (C), the aforementioned resist layer 40 is used as a mask to form the interlayer contact pillars 8 by etching the aforementioned copper layer 38. When performing the etching, the etching barrier layer 36 made from, for example, nickel as described above, fulfills the role of preventing the etching solution from corroding the interconnection layers 6 and 6a.

After this, as shown in FIG. 4 (D), the aforementioned resist layer 40 is removed, after which the interlayer contact pillars 8 are used as a mask and the aforementioned barrier layer 36 is removed.

After the completion of the processes shown in FIG. 4 (D), the board is processed by the series of processes beginning with the process shown in FIG. 2 (H).

Figure 5A:
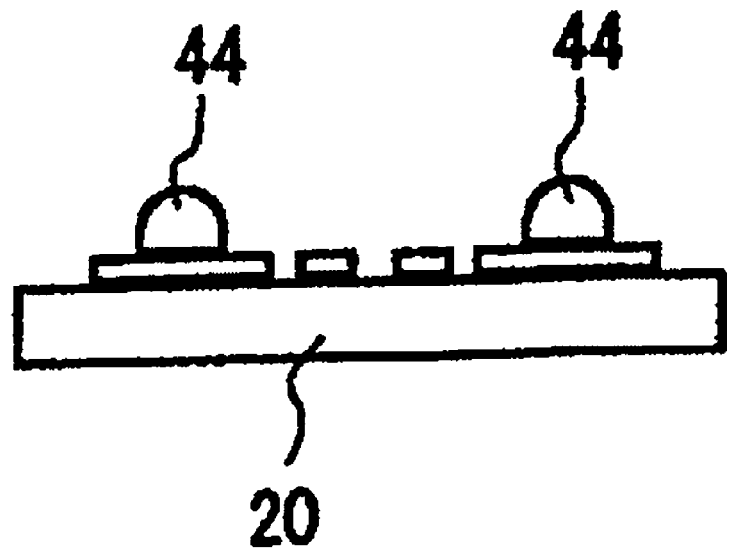
FIGS. 5 (A) and (B) are cross-sectional drawing showing a variation of the embodiment shown in FIG. 1 (C) in which stud bumps or solder bumps are provided as the posts or interlayer contact pillars.
Figure 5B:
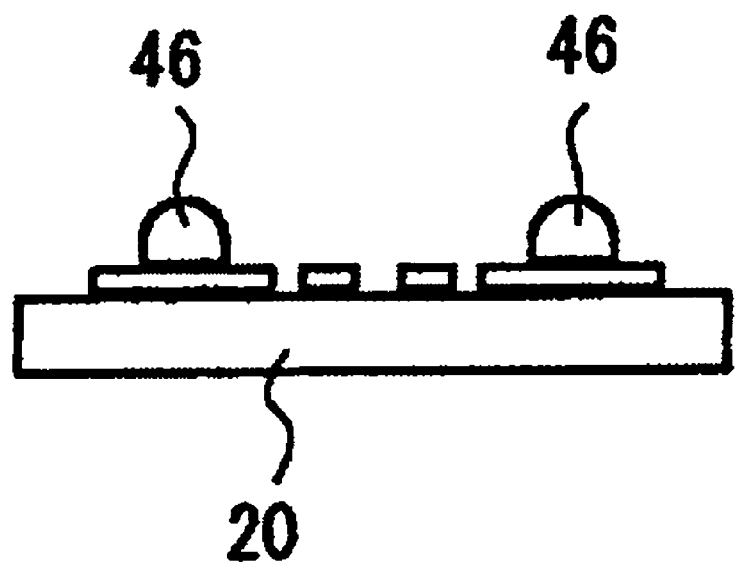

FIGS. 5 (A) and (B) are explanatory diagrams for the technology for fabrication stud bumps 44, made from, for example, gold, or for fabricating solder bumps 46, through applying a portion of the technology shown in FIGS. 2 (A) through (L).

After the completion of the process shown in FIG. 2 (D), stud bumps 44, made from, for example, gold, are fabricated as shown in FIG. 5 (A) on the surface of the interconnection layer 6, or solder bumps 46 are fabricated as shown in FIG. 5 (B).

After this, in a variation of the method of manufacturing a wiring board shown in FIGS. 2 (A) through (L), stud bumps 42 made from gold, or the like, or solder bumps 44, are used as the connections pillars instead of the plated pillars as described above, after which the interlayer insulation layer 4 is fabricated.

FIGS. 6 (A) through (H) are cross-sectional diagrams showing the manufacturing process in yet another example of a method of manufacturing an interconnection element or a wiring board layer.

First, as shown in FIG. 6 (A), a metal plate 60 with a five-layer structure is prepared. The bottom most layer of this metal plate 60 is a carrier layer 20 preferably including or consisting essentially of copper, where the next layer is an etching barrier layer 62 made from nickel, the next layer is a copper layer 64 that will form the interconnection layer 6 and 6a, the next layer is an etching barrier layer 66 made from nickel, and the top most layer is a copper layer 68 that will become the interlayer contact pillars 8.

Next, as shown in FIG. 6 (B), a resist layer 70 is formed selectively on the surface of the copper layer 68 that will become the interlayer contact pillars 8.

Next, as shown in FIG. 6 (C) the aforementioned resist layer 70 is used as a mask to fabricate the interlayer contact pillars 8 through selectively etching the aforementioned copper layer 68. At this time, the etching barrier layer 66 fulfills the role of preventing the etching fluid from corroding the copper layer 64 that will become the interconnection layer 6 and 6a.

Next, as shown in FIG. 6 (D), the aforementioned resist layer 70 is removed.

Figure 6A:
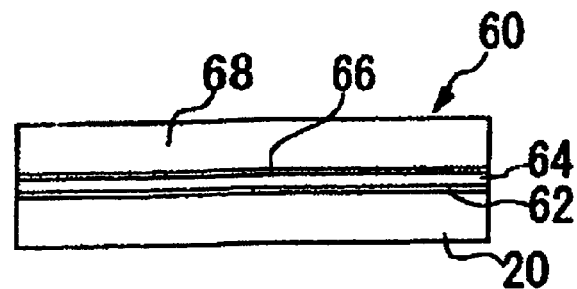
FIG. 6 (A) through (H) are cross-sectional drawings showing the manufacturing process for yet another method of manufacturing the interconnect element or wiring board layer according to the present invention.
Figure 6B:
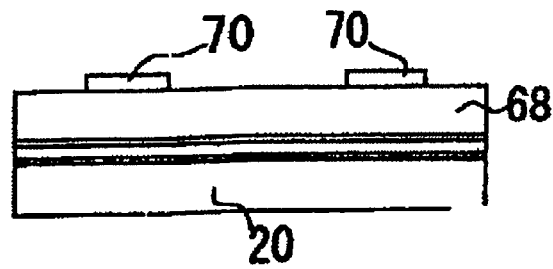
Figure 6C:
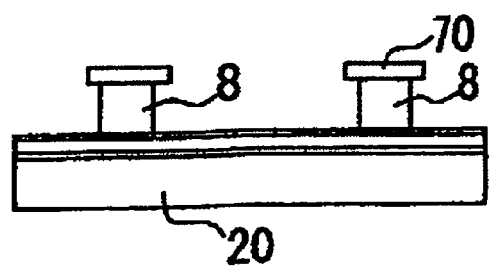
Figure 6D:
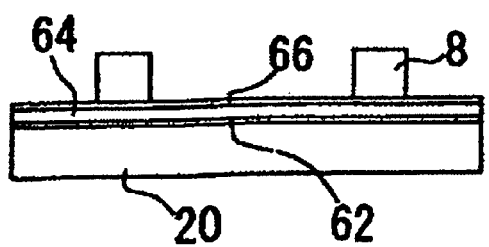
Figure 6E:
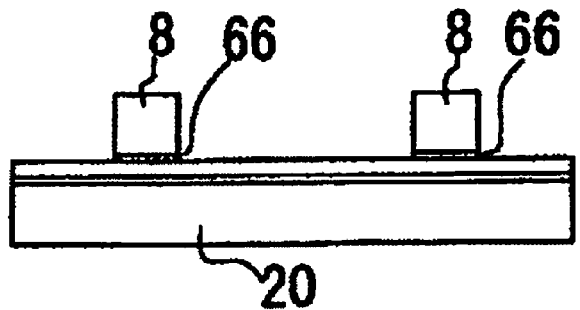
Figure 6F:
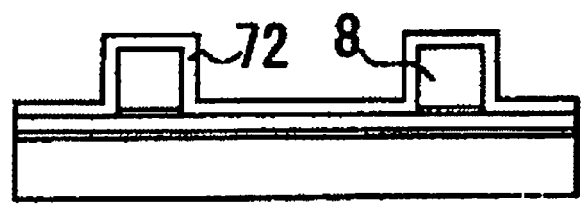
Figure 6G:
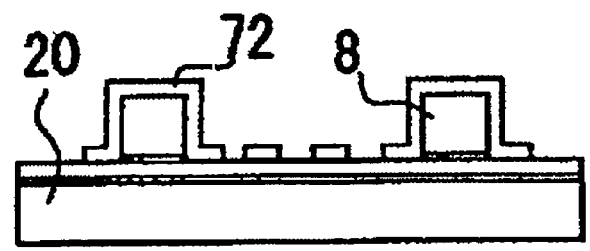
Figure 6H:
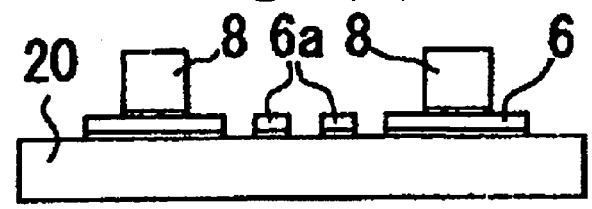

Next, as shown in FIG. 6(E), the aforementioned interlayer contact pillars 8 are used as a mask and the etching barrier layer 66 is removed except where it underlies the interlayer contact pillars 8.

Next, as shown in FIG. 6 (F), a resist layer 72 is formed over the entire surface.

Next, the aforementioned resist layer 72 is patterned through photolithographic exposure and development.

Next, the patterned resist layer 72 is used as a mask to fabricate the interconnection layers 6 and 6a through etching the aforementioned copper layer 64, after which this resist layer 72 is removed. FIG. 6 (H) shows the state after the resist layer 72 has been removed.

After this, the board is processed by the series of processes beginning with the process described above relative to FIG. 2 (H).

Figure 7A:
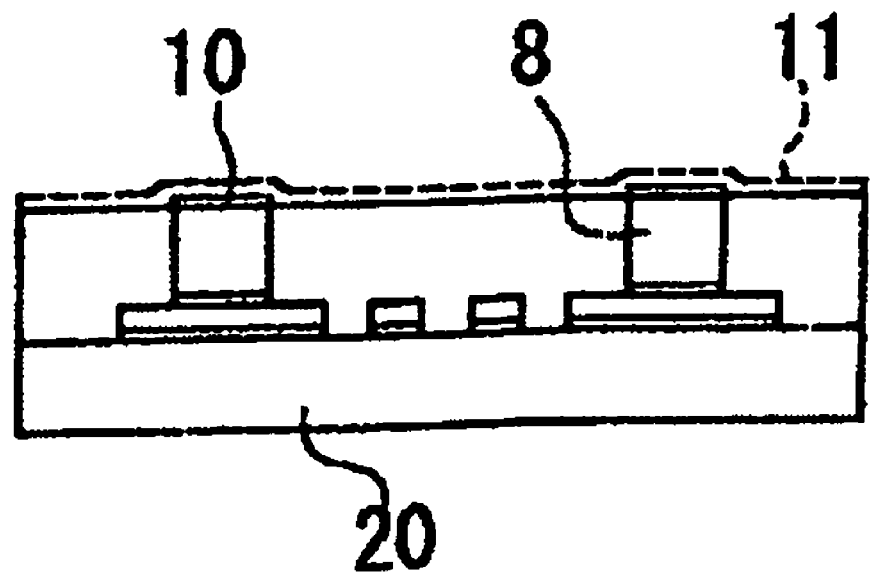
FIGS. 7 (A) and (B) are cross-sectional drawings for explaining the method of protecting a bond metal layer prior to removing, through etching, the carrier layer that is made from copper.
Figure 7B:
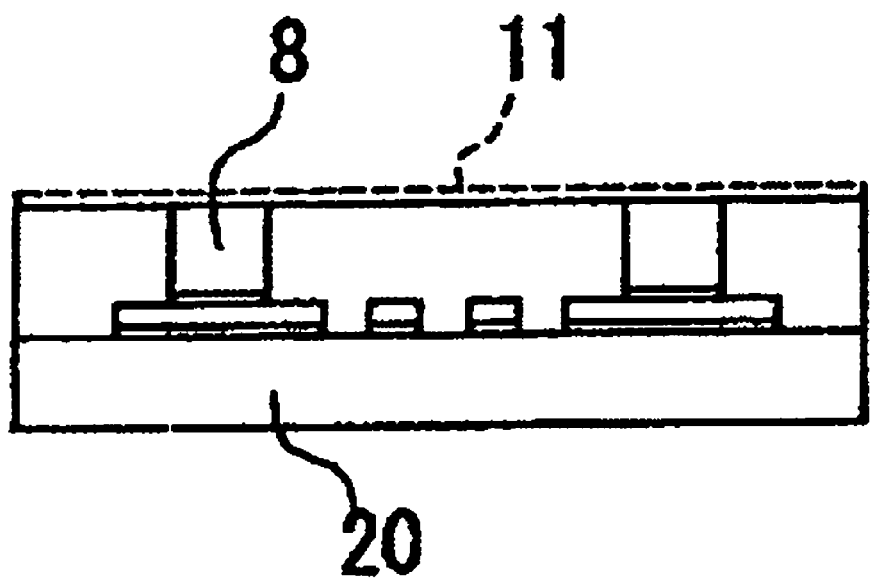

FIGS. 7 (A) and (B) are cross-sectional diagrams showing the preferred state when the carrier layer 20, which includes or consists essentially of copper, is removed through etching.

FIGS. 7(A) and (B) illustrate a method of protecting the bond metal layer 10 from corrosion when a copper-containing (or other metal-containing) carrier layer 20 is removed, as by etching such carrier layer. Thus, in the embodiment shown in FIGS. 7 (A) and (B), the carrier layer 20 is etched in a state wherein the bond metal layer 10 on the surfaces of the interlayer contact pillars 8, is protected by a protective film 11 (shown by the dotted line).

Figure 8A:
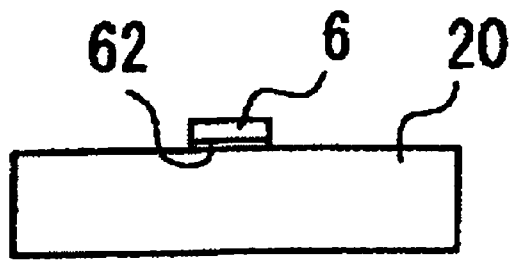
FIG. 8 (A) through (C) are cross-sectional drawings showing a method of manufacturing according to yet another embodiment in which the interconnect element has a landless structure.
Figure 8B:
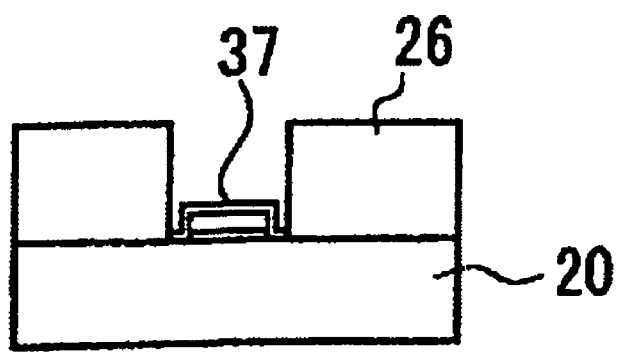
Figure 8C:
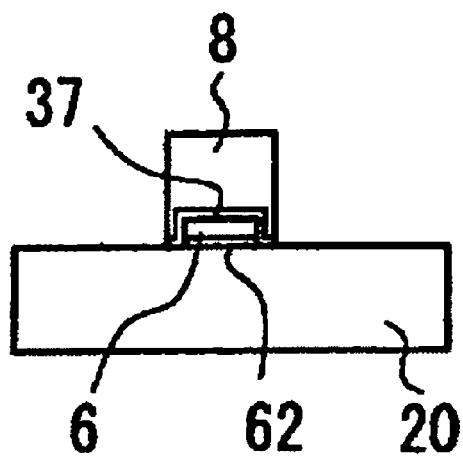

FIGS. 8 (A) through (C) are cross-sectional diagrams showing a variation of the above-described embodiment shown in FIGS. 2 (A) through 2 (K). In this embodiment, the parts of the interconnection layer 6 whereon the interlayer contact pillars 8 are fabricated have a landless structure. The landless structure can help increase the level of integration as by increasing the wiring density of the interconnect element. Here, this is achieved through reducing the surface area of the parts of the interconnection layer 6 with which the interlayer contact pillars 8 are in direct contact as shown in FIG. 8 (C).

As is shown FIG. 8 (A), the interconnection layer 6 has been fabricated on a carrier layer 20 which includes a metal, preferably copper. 62 is an etching barrier layer interposed between the interconnection layer 6 and the carrier layer 20, including, for example, a nickel layer. In this case, using a landless structure requires that the parts of the interconnection layer 6 on which the interlayer contact pillars 8 are formed have dimensions that are smaller than those of the completed interlayer contact pillars 8.

Next, as shown FIG. 8 (B), a resist layer 26 is deposited and photolithographically patterned, after which the resist layer 26 is used as a mask in fabricating an etching barrier layer 37 made from, for example, nickel, through plating.

Next, the aforementioned resist layer 26 is used as a mask in fabricating the interlayer contact pillars 8 through plating of copper, for example, after which the resist layer 26 is removed. FIG. 8 (C) shows the state after the resist layer 26 has been removed.

After this, the carrier layer 20 is removed. When the carrier layer 20 includes copper, the etching barrier layer 62 protects other copper containing structures such as the interconnection layer 6 from being attacked and the etching barrier layer 37 fulfills the role of protecting the interlayer contact pillars 8 during such process.

FIGS. 9 (A) through (D) are cross-sectional drawings showing the manufacturing process of yet another example of a method for manufacturing an interconnection element which may be a wiring board layer. In the present example, a wiring board layer 2 is provided wherein a metal layer 82 is used to improve bonding such as wire bonding characteristics, and includes gold, silver, nickel, or the like, on the surfaces of each of the interconnection layers 6 and 6a.

Figure 9A:
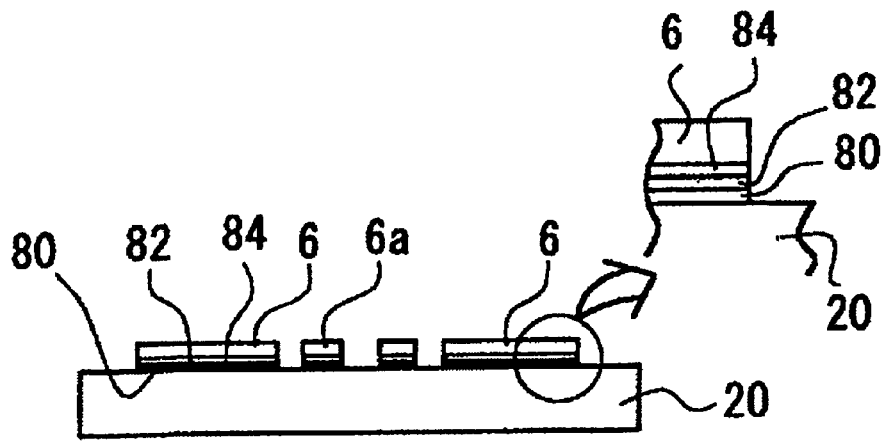
FIG. 9 (A) through (D) are cross-sectional drawings showing a method of manufacturing according to yet another embodiment in which the interconnect element includes a bond metal formed on external surfaces of traces provided in interconnection layers 6, 6*a*.
Figure 9B:
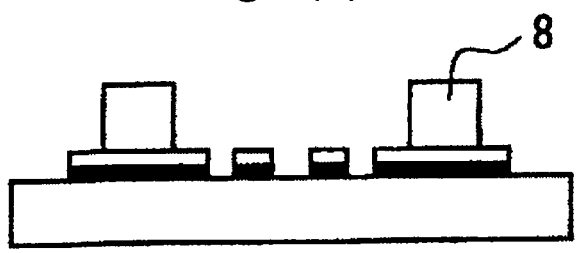
Figure 9C:
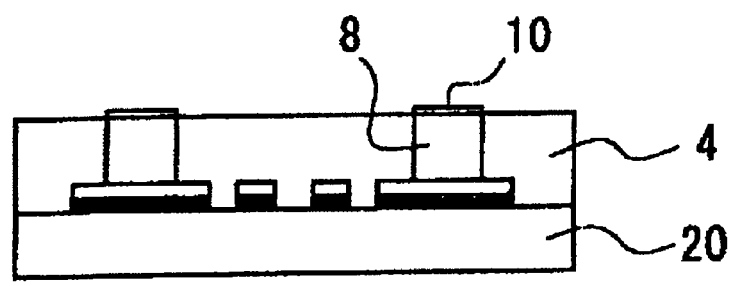
Figure 9D:
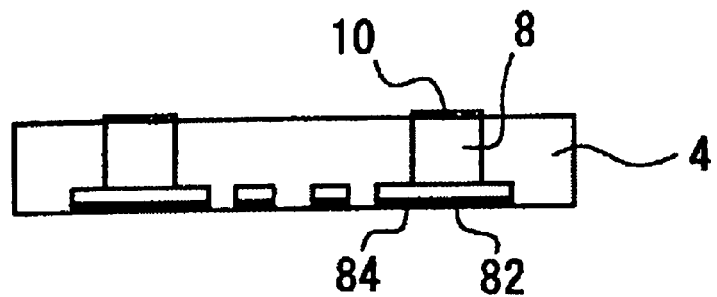
Figure 10A:
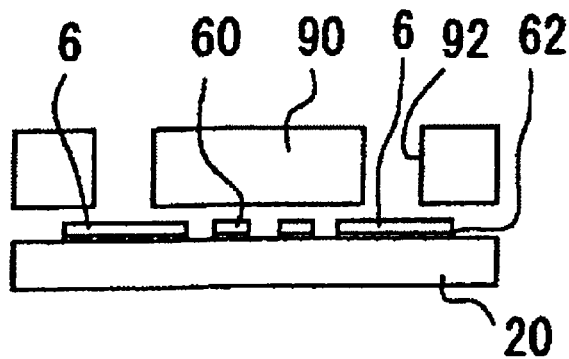
FIG. 10 (A) through (D) are cross-sectional diagrams showing yet another embodiment of a method of manufacturing an interconnect element or wiring board layer according to the present invention.
Figure 10B:
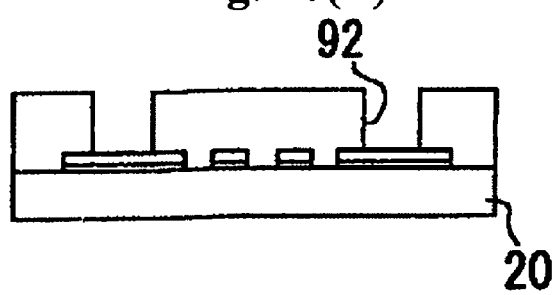
Figure 10C:
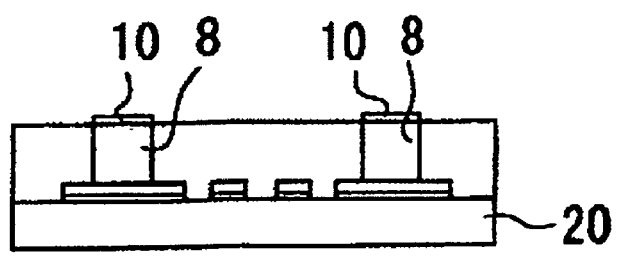
Figure 10D:
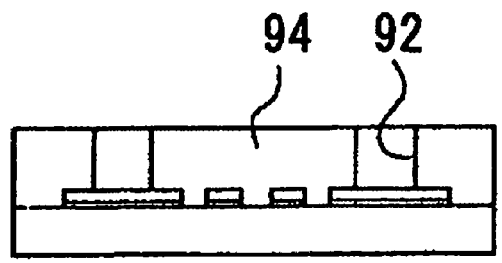
Figure 11A:
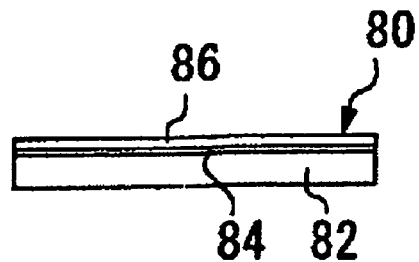
FIG. 11 (A) through (F) are cross-sectional diagrams showing yet another embodiment of a method of manufacturing an interconnect element or a wiring board layer according to the present invention.
Figure 11B:
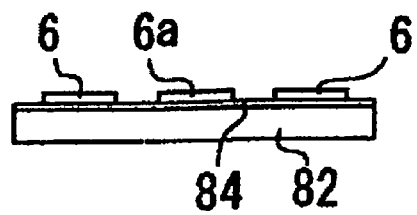
Figure 11C:
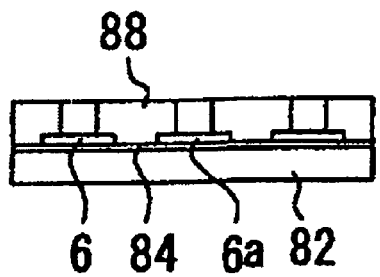
Figure 11D:
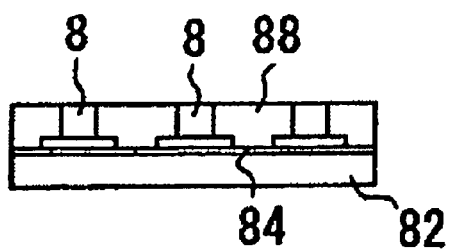
Figure 11E:
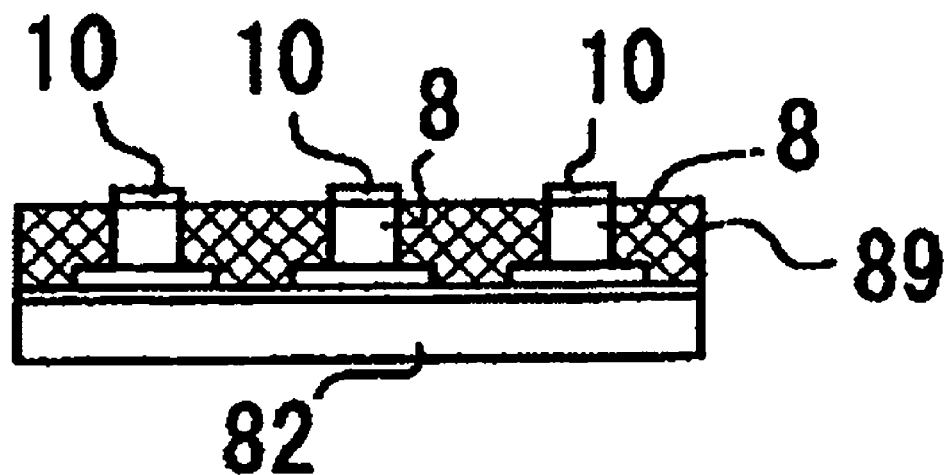
Figure 11F:
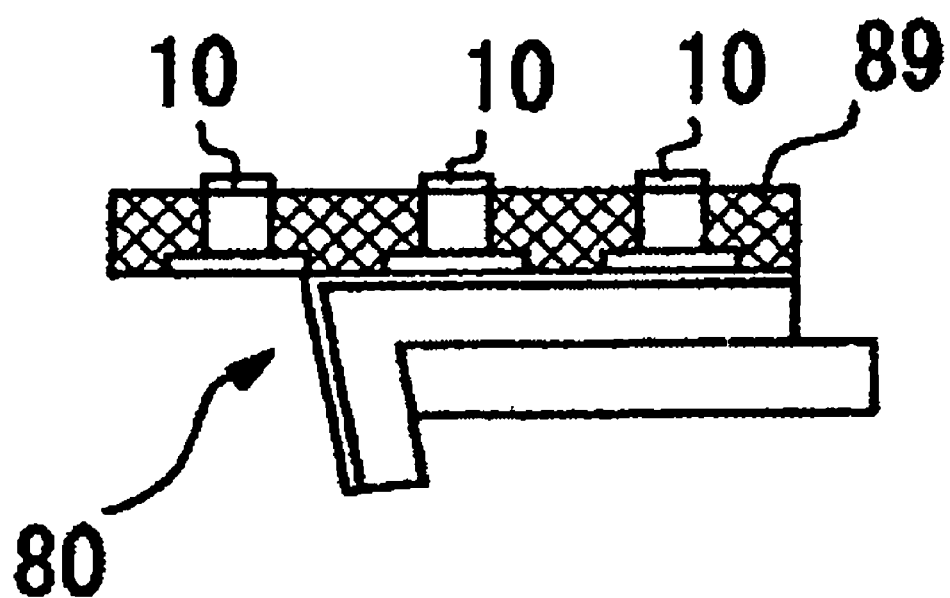

On a carrier layer 20 made from copper, interconnection layer 6 and 6a are fabricated on a three-layer underlying structure made from nickel, gold, and nickel through selective plating, for example. FIG. 9(A) shows the state after the fabrication of the interconnection layers 6 and 6a.

The underlying structure includes an etching barrier layer such as a nickel layer 80, gold layer 82, and a second etching barrier layer such as another nickel layer 84. The fabrication of the interconnection layers 6 and 6a including these underlying layers 80, 82, and 84 can be performed, for example, by first depositing and patterning a resist layer, and then using the patterned resist layer as a mask for plating, sequentially, the nickel layer 80, the gold layer 82, the nickel layer 84, and then the copper.

Thereafter, as shown in FIG. 9 (B), the interlayer contact pillars 8 are fabricated on the aforementioned interconnection layer 6. The fabrication of the interlayer contact pillars 8 can also be performed through using a selectively fabricated resist layer as a mask and performing copper plating.

Next, as shown in FIG. 9 (C), an interlayer insulation layer 4 is fabricated on the side whereon the aforementioned interconnection layers 6 and 6a and the interlayer contact pillars 8, etc., are fabricated. A bond metal layer 10 which may include a low melting point metal is formed through plating or other deposition process onto the surfaces of the interlayer contact pillars 8 that are exposed at the surface of the interlayer insulation layer 4.

Next, as shown in FIG. 9 (D), the carrier layer 20 is removed, as by etching selectively so as to preserve the etching barrier layer 84, e.g., nickel layer 84. During this etching process the nickel layer 84 may be etched slightly to expose the gold layer 82. The nickel layer 84 fulfills the role of protecting the gold layer 82.

Given this method, the gold layer 82 can be fabricated easily on each of the interconnection layers 6 and 6a through electrolytic plating. This is because the carrier layer 20 serves as an electrically conductive path for each of the interconnection layers 6 and 6a during the electrolytic plating.

With the process shown in FIG. 9, electrolytic plating can be performed to form a gold layer on the interconnection layer 6, 6a without requiring troublesome operations to plate such gold layer after the fabrication of individual wiring board layers as shown in FIG. 1 (C).

FIG. 10 (A) through (C) are cross-sectional drawings showing the manufacturing process in yet another example of a method for manufacturing a wiring board. The present example uses a method for fabricating a resin mask pattern that will serve as the mask for fabricating the interlayer contact pillars, and uses a method wherein there is selective illumination using a laser beam.

As is shown FIG. 10 (A), a resin film 90 that has been patterned using a laser beam is aligned onto a carrier layer 20, made from copper, on which the interconnection layers 6 and 6a have been fabricated. 92 is a hole that has been formed by the laser beam, where the interlayer contact pillars will be formed within the holes 92.

Next, as shown in FIG. 10 (B), the resin film is placed on the aforementioned carrier layer 20.

Next, the interlayer contact pillars 8 are fabricated on the aforementioned interconnection layer 6 through plating, using the aforementioned resin film as a mask, after which the low melting point metal layer 10 for improved connectivity is fabricated through plating. FIG. 10 (C) shows the state after the fabrication of the low melting point layer 10 for improved connectivity.

Note that after this the resin film 90 may be removed and interlayer insulation layer may be fabricated or the resin film 90 may be used itself as the interlayer insulation layer. Note that, as shown in FIG. 10 (D), after a liquid resin 94 has been coated and adequately dried, this resin 94 is patterned by a laser beam to assume the form as shown in FIG. 10 (B), after which the interconnect element is processed by the processes shown in FIG. 10 (C). This process may be used as well.

FIGS. 11 (A) through (F) are cross-sectional drawings showing the manufacturing process in another example in a method for manufacturing a wiring board. In the present example, a resin film to which a copper foil is applied is used as the carrier.

As shown in FIG. 11 (A), a copper-foil-laminated resin film 80 includes a film part 82 including a resin, to which a copper layer 86 is adhered, by an adhesive 84, to one surface thereof.

Next, as shown in FIG. 11 (B), the interconnection layers 6 and 6a are fabricated through patterning through selectively etching the copper layer 86.

Next, as shown in FIG. 11 (C), a resist layer 88 that will serve as the mask for fabricating the interlayer contact pillars (8) is deposited and patterned.

Next, as shown in FIG. 11 (D), the interlayer contact pillars 8 are fabricated through plating of copper, using the aforementioned resist layer 88 as a mask.

Next, the aforementioned resist layer 88 is removed, an interlayer insulation layer 89 is fabricated, and then the interlayer contact pillars 8 are fabricated by plating such as by copper plating, after which a bond metal layer 10 which may include a low melting point metal is fabricated through plating. FIG. 11 (E) shows this state after the formation of the bond metal layer 10.

Following this, as shown in FIG. 11 (F), the aforementioned resin film 82 is stripped, such as by peeling as shown in FIG. 11 (F) or other technique. Doing so completes the interconnection element or wiring board layer.

As these and other variations and combinations of the features set forth above can be utilized, the foregoing description of the preferred embodiment should be taken by way of illustration rather than by limitation of the invention.

INDUSTRIAL APPLICABILITY

The present invention can be used in, among others, in interconnect elements, e.g., wiring boards, etc. wherein a plurality of metal traces of an interconnection layer are exposed at one of the surfaces of a dielectric element, e.g., an interlayer insulation layer made from, for example, a resin such as a thermoplastic. Posts or interlayer contact pillars, made from a metal such as, for example, copper extend through such dielectric element. Such posts or pillars can provide interlayer connections corresponding to at least portions of interconnection layers of respective layers of a multilayer wiring boards. In addition, the present invention finds use in methods of making interconnect elements and in methods of manufacturing multilayer wiring boards.

The invention claimed is:
1. A chip package comprising:
an integrated circuit chip having terminals exposed at an exterior thereof; and
an interconnect element external to said integrated circuit chip and mounted to said terminals of said chip with a bond metal, said interconnect element comprising:
a dielectric element external to said chip, said dielectric element having a first major surface, a second major surface remote from said first major surface, and a plurality of recesses extending inwardly from said first major surface;
a plurality of metal traces embedded in said plurality of recesses, said metal traces having outer surfaces substantially co-planar with said first major surface and inner surfaces remote from said outer surfaces, said plurality of metal traces including a first metal;
a plurality of posts extending from said inner surfaces of said plurality of metal traces through said dielectric element, said plurality of posts having tops exposed at said second major surface and said plurality of posts including a second metal, at least one of said plurality of metal traces or said plurality of metal posts being exposed at one of said first or second major surfaces of said interconnect element;

a plated metal layer including a third metal adjacent surfaces of said posts and being disposed between each of said plurality of posts and said plurality of metal traces, said plated metal layer having a composition and sufficient thickness such that said plated metal layer is capable of protecting said surfaces of said posts from attack during an etching process in which an etchant which attacks said second metal is used to remove a portion of said second metal not protected by said plated metal layer, and a bond metal electrically connecting said at least one of said plurality of said metal traces or said plurality of said metal posts with said terminals of said integrated circuit chip.

2. The chip package as claimed in claim 1, wherein said bond metal contacts said outer surfaces of said plurality of metal traces.

3. The chip package as claimed in claim 1, wherein each of said plurality of posts has an external surface area greater than a surface area of said outer surface of one of said plurality of metal traces from which each said post extends.

4. The chip package as claimed in claim 1, wherein said dielectric element includes a thermoplastic.

5. The chip package as claimed in claim 1, wherein said plurality of metal traces include copper and said plurality of posts include copper.

6. The chip package as claimed in claim 1, wherein said plurality of posts project beyond said second major surface.

7. The chip package as claimed in 6, wherein each of said posts includes a base, structure including a first metal extending from said plurality of metal traces, wherein said bond metal overlies said first metal at said tops of said posts.

8. The chip package as claimed in claim 7, wherein said first metal has a first melting point and said bond metal has a second melting point lower than said first melting point.

9. A multi-layer assembly including a plurality of chip packages, each chip package as claimed in claim 1, wherein said plurality of posts of a first one of said plurality of chip packages are joined to said outer surfaces of said plurality of metal traces of a second one of said plurality of chip packages.

10. The multi-layer assembly as claimed in claim 9, further comprising a second bond metal disposed between said plurality of posts of said first one of said plurality of chip packages and said plurality of metal traces of said second one of said plurality of chip packages.

11. The chip package as claimed in claim 1, wherein said first metal and said second metal are the same metal.

12. The chip package as claimed in claim 1, wherein the plated metal layer includes nickel.

* * * * *